United States Patent [19]

Nii et al.

[11] Patent Number: 4,503,600
[45] Date of Patent: Mar. 12, 1985

[54] PROCESS FOR MANUFACTURING A BURIED GATE FIELD EFFECT TRANSISTOR

[75] Inventors: Riro Nii, Tokyo; Nobuyuki Toyoda; Akimichi Hojo, both of Yokohama, all of Japan

[73] Assignee: Tokyo Shibaura Denki Kabushiki, Kawasaki, Japan

[21] Appl. No.: 466,578

[22] Filed: Feb. 15, 1983

[30] Foreign Application Priority Data

Feb. 22, 1982 [JP] Japan .................................. 57-25909

[51] Int. Cl.³ .......................................... H01L 21/265
[52] U.S. Cl. .......................................... 29/571; 29/574; 29/576 B; 29/576 E; 29/578; 29/591; 148/175; 148/187
[58] Field of Search ...................... 29/571, 574, 576 B, 29/576 E, 578, 591; 148/175, 187

[56] References Cited

U.S. PATENT DOCUMENTS

| | | | |
|---|---|---|---|
| 3,946,415 | 3/1976 | Cook | 29/589 X |
| 4,265,934 | 5/1981 | Ladd | 29/571 X |
| 4,301,188 | 11/1981 | Niehaus | 29/571 X |
| 4,374,455 | 2/1983 | Goodman | 29/571 |
| 4,379,005 | 4/1983 | Hovel et al. | 148/178 X |
| 4,404,732 | 9/1983 | Andrade | 148/175 |

OTHER PUBLICATIONS

Inst. Phys. Conf. Ser. No. 63: Chapter 11, Japan, Sep. 20, 1981, Toyoda et al., "An Application of Pt-GaAs Reaction to GaAs ICS", pp. 521-526.

*Surface Science* 113, Jan. 1982, Takashi Mimura, "The Present Status of Modulation-Doped and Insulated-Gate Field-Effect Transistors in III-V Semiconductors", pp. 454-463, North-Holland Publishing Co.

*Electronics Letters*, vol. 18, No. 3, Feb. 4, 1982, Tung et al., "High-Speed Two-Dimensional Electron-Gas FET Logic", pp. 109-110.

*Primary Examiner*—G. Ozaki
*Attorney, Agent, or Firm*—Oblon, Fisher, Spivak, McClelland & Maier

[57] ABSTRACT

A process for manufacturing a buried gate field effect transistor having a small effective gate length, which process enables precise control of the threshold voltage. First, a compound semiconductor crystal having a first impurity region as a source region, a second impurity region as a drain region and a channel layer buried inside the compound semiconductor crystal is prepared by a conventional process. A V-shaped groove is then formed with an etching solution having high selectivity toward the crystal face in the gate region of this compound semiconductor crystal. Onto the inner wall surface of the V-shaped groove, a metal likely to form an alloy type of Schottky junction with the compound semiconductor is vapor-deposited. The resultant structure is heated, while measuring the threshold voltage, to form an alloy type of Schottky junction and for use of this junction as a gate electrode.

5 Claims, 9 Drawing Figures

PROCESS FOR MANUFACTURING A BURIED GATE FIELD EFFECT TRANSISTOR

BACKGROUND OF THE INVENTION

1. Field of the Invention

The present invention relates to a process for manufacturing a buried gate field effect transistor. Specifically, the present invention is concerned with a process for manufacturing a buried gate field effect transistor comprised of a compound semiconductor and having a Schottky junction in its V-shaped groove.

2. Description of the Prior Art

In the prior art, an increase in frequency and operational speed of a field effect transistor (FET) using a compound semiconductor, e.g., GaAs crystal, was basically achieved by shortening the gate length to increase its mutual conductance, thereby causing a decrease in the gate capacitance. In view of the fabrication technique, however, it is difficult to form a gate having a gate length of below 0.5 $\mu$m.

As an example of a current attempt to shorten the effective gate length, there is known to exist a Schottky gate FET, having a V-shaped groove formed in an n-type layer at a surface of a single crystal of silicon, which is contained in the FET. This type of FET is described, for example, in Tsung D. Mok et al, IEEE TRANSACTIONS ON ELECTRON DEVICES, VOL. ED-25, No. 10, October, 1978. In this FET, a metal, such as Al, is deposited on the inner face of the V-shaped groove to form a gate electrode. The n-type region near the bottom end of the V groove acts as an effective channel in the FET. Since the bottom end of the V-shaped groove is of course pointed, the effective gate length is shortened.

In the above-mentioned FET, however, the gate electrode is formed on the entire surface of the inner wall of the V-shaped groove and this V groove is formed in the n-type single crystal layer of silicon having conductivity. The gate capacitance, therefore, becomes rather great. Further, the V groove is formed by chemical etching. However, if this V groove is formed by chemical etching, it becomes impossible to control the depth of the groove with a high degree of reproducibility. For this reason, the depth of the V groove varies with each treated wafer and, accordingly, the threshold voltage of FET also varies according to wafer. Thus, disadvantage is brought about in the prior art process.

Further, even when such FET has no V groove, the threshold voltage of FET using the n-type single crystalline layer at the surface as a channel is low in reproducibility, since that threshold voltage is substantially determined during the process of forming the n-type surface crystal.

SUMMARY OF THE INVENTION

Accordingly, one object of the invention is to provide a process for manufacturing a V groove type buried gate FET which is capable of shortening the effective length of its gate without causing an increase in the gate capacitance.

Another object of the invention is to provide a process for manufacturing a V groove type buried gate FET which is capable of controlling the threshold voltage with high precision.

In the process of the invention, there is first provided, by an ordinary method, a compound semiconductor crystal having a first impurity region which becomes a source region, a second impurity region which becomes a drain region and a channel layer which is within the crystal compound. Next, a V-shaped groove is formed in a region located between the first and second impurity regions, i.e., in a gate region, by using a highly selective etching solution on the crystal face. Next, a metal likely to form an alloy type of Schottky junction with the compound semiconductor crystal is deposited onto the inner wall of this V groove. Finally, the resultant structure is heated to promote conversion of the metal and compound semiconductor into an alloy, thereby forming the alloy type of Schottky junction. Since the compound semiconductor portion in the vicinity of the V groove is converted into an alloy along the slope of the V groove, the V groove is deepened maintaining the shape of its bottom end as the heating operation continues. The threshold voltage of FET is shifted from negative to positive as the distance between the bottom end of the groove and the channel layer is shortened. Accordingly, the threshold voltage varies, depending upon the extent to which the heating is carried out. The heating is conducted until a prescribed level of threshold voltage is obtained.

In the FET prepared according to the process of the invention, the bottom end portion of the pointed V groove serves as the gate, with the result that the effective length thereof is shortened to approximately 0.1 $\mu$m, one fifth of the conventional effective gate length. In the FET prepared by means of this process and according to preferred embodiments of the invention, as later described, the V groove is, for the most part, formed in the undoped semiconductor containing fewer carriers. Unlike the prior art technique, therefore, even formation of the V groove does not substantially cause an increase in the gate capacitance. Furthermore, according to the invention, it is possible to control the level of the FET threshold voltage in accordance with the extent of the heating operation. It is therefore possible to control that voltage with a high degree of precision.

DETAILED DESCRIPTION OF THE PREFERRED EMBODIMENTS

Preferred embodiments of the invention will now be described with reference to the accompanying drawings.

Figure 1:
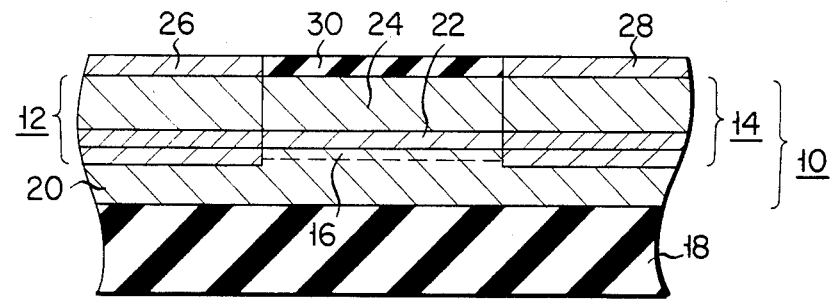
FIGS. 1 to 7 are sectional views which help to explain the process of the present invention.

First, as shown in FIG. 1, a compound semiconductor crystal 10 is prepared which has a first impurity region 12 as a source region, a second impurity region 14 as drain region and a channel layer 16 buried inside the crystal 10. A representative example of the compound semiconductor is GaAs. Generally, in an FET (Field Effect Transistor), the compound semiconductor crystal 10 is formed on a substantially insulative substrate 18, e.g., a semi-insulative GaAs substrate. Ideally, the compound semiconductor crystal 10 should have a structure such as that shown in FIG. 1. On the substrate 18, a first undoped n-type GaAs layer 20 is formed and, on this GaAs layer 20, an AlGaAs layer 22 doped with Si as a doner impurity is formed. Preferably, the Al- GaAs should be expressed by the formula $Al_xGa_{1-x}As$ ($x \sim 0.3$). Upon formation of the AlGaAs layer 22 on the GaAs layer 20, a channel layer 16 in which high mobility electrons have accumulated is generated. The FET prepared by the process of this invention has, in this way, the channel layer buried inside the compound semiconductor crystal. On the AlGaAs layer 22, a second undoped n-type GaAs layer 24 is formed. The first impurity region 12 becoming the source region and the second impurity region 14 becoming the drain region are formed in such a manner as to penetrate the second undoped n-type GaAs layer 24 and the AlGaAs layer 22 in a depthwise direction, reaching the inside of the first undoped n-type GaAs layer 20. As a result, the channel 16 is allowed to intervene between the first impurity region 12 and the second impurity region 14. A first metal layer 26, which becomes a source electrode, is formed on the first impurity region 12. A second metal layer 28, which becomes a drain electrode, is formed on the second impurity region 14. The first and second metal layers, 26 and 28, are preferably formed of an Au-Ge alloy which allows a good ohmic contact between them. On a portion of the second undoped n-type GaAs layer 24, located or interposed between the first impurity region 12 and the second impurity region 14, there is formed an insulative layer 30 consisting of, e.g. CVD $SiO_2$.

Since this structure is known and is easily fabricated by a method widely known to those skilled in the art, a detailed description of the method for manufacturing the structure is omitted herein. To explain briefly, however, the substrate 18 is formed thereon with the first undoped n-type GaAs layer 20, AlGaAs layer 22 and the second undoped n-type GaAs layer 24, in that order, by use of the known Molecular Beam Epitaxy method. Next, on the whole surface of the second undoped n-type GaAs layer 24, a CVD $SiO_2$ layer is deposited. Using a photoresist film, the areas of the CVD $SiO_2$ layer which cover the prospective first and second impurity regions 12 and 14 are selectively etched off, thereby forming the insulative film 30. Thereafter, the first and second impurity regions, 12 and 14 are formed by implantation of an impurity ion such as the S ion into the compound semiconductor crystal 10, using the insulative film 30 and the photoresist film remaining on the insulative film 30 as a mask. Finally, the first and second metal layers, 26 and 28, are formed by vapor deposition.

Figure 2:
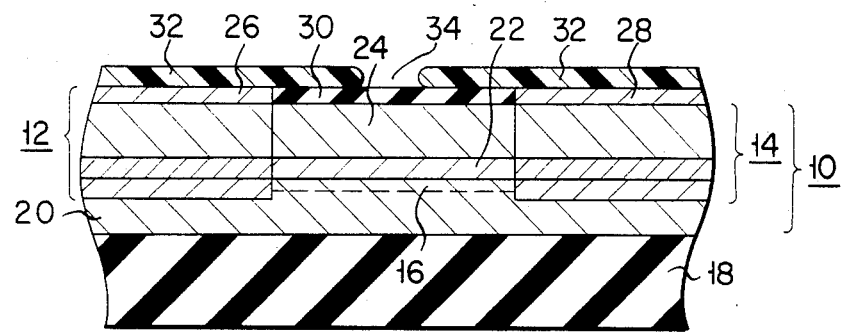

Next, as shown in FIG. 2, a photoresist film 32 is formed on the entire surface of the structure and an opening portion 34 is formed by a widely known direct electron beam method, in a portion to be formed with a V-shaped groove in a succeeding process step. Preferably, the length of this portion is made as small as possible for the purpose of decreasing the gate length. At the current level of technology, it is possible to form the opening portion with a width of 0.5 μm. In this case, the widthwise direction (perpendicular direction to the drawing sheet) of the opening portion is made parallel to an intersecting line between the face (100) which is the surface of a single crystal of the GaAs layer 24, and the face (110) thereof. By so doing, in a succeeding etching step, the V-shaped groove is formed along the face, (110) or (111), depending upon the kind of etching solution employed.

Figure 3:
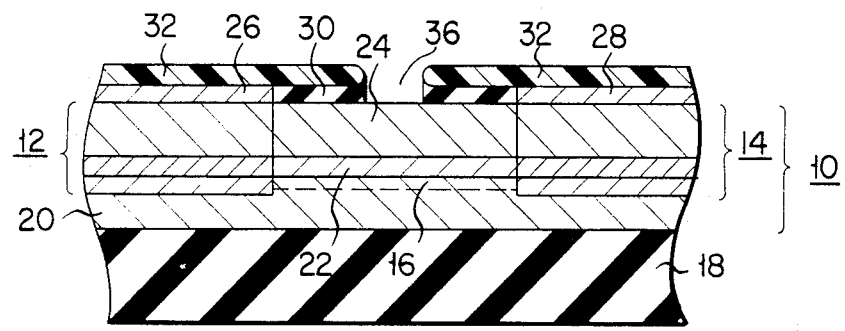

Then, by using the photoresist 32 as a mask, as shown in FIG. 3, part of the insulative film 30 is removed by a known etching technique thereby forming a gate window 36.

Figure 4:
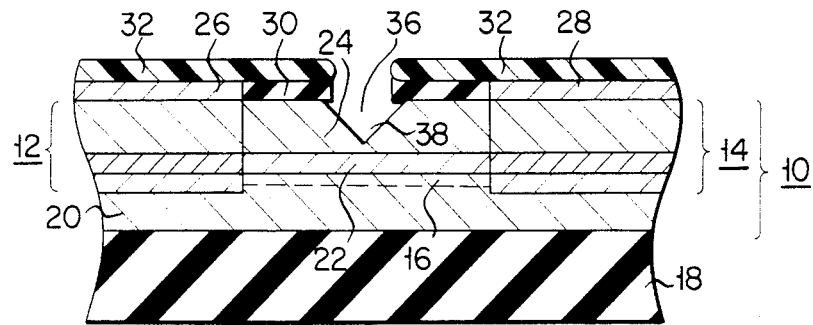

Following this, as shown in FIG. 4, the second undoped n-type GaAs layer 24 exposed from the gate window 36 is etched with an etching solution having high selectivity toward the crystal face, thereby forming a V-shaped groove 38 in the portion of that layer 24 located beneath the gate window 36. The etching solution having high selectivity toward the crystal face is known and includes, e.g., a mixture of 50% aqueous tartaric acid solution and 30% aqueous hydrogen peroxide solution in a ratio of 5:1, which etches the layer 24 along the face (110).

Figure 5:
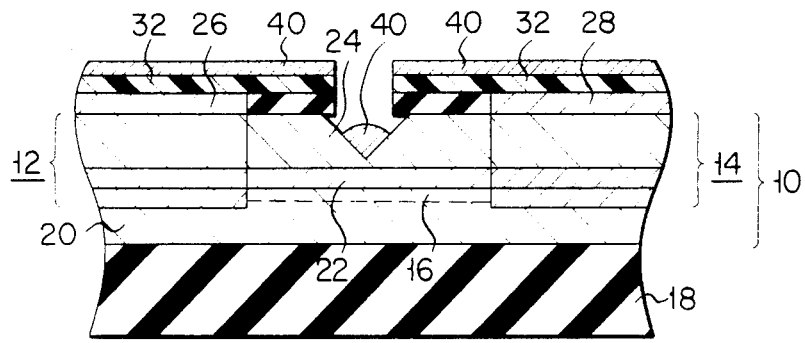

The next step, as shown in FIG. 5, is to deposit a metal 40, which is likely to form an alloy type of Schottky junction with GaAs and AlGaAs, onto the inner wall of the V-shaped groove. Such metal includes, for example, Pt and Rh. Since such a deposit is to cover the entire surface of the structure, the metal 40 is deposited onto the photoresist film layer 32, as well.

Figure 6:
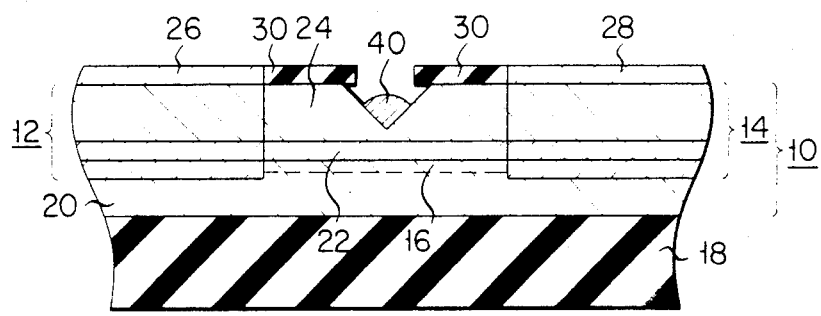

Next, as shown in FIG. 6, the photoresist film 32 and the metal layer 40 are each removed by carrying out the lift-off step which is widely known.

Figure 7:
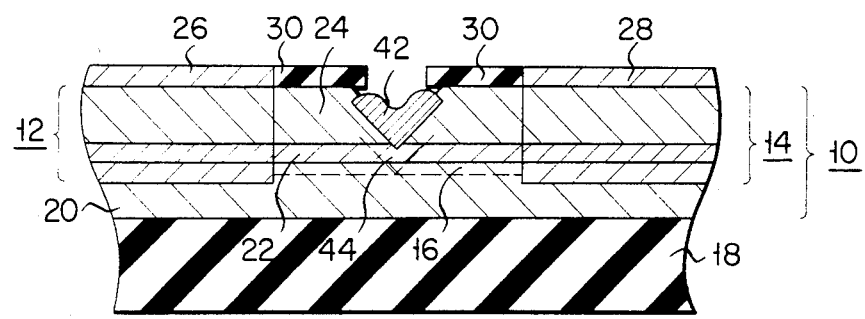
Figure 8:
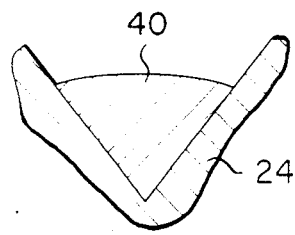
FIGS. 8 and 9 are each an enlarged sectional view of the V groove before and after the heating step of the process of the invention.
Figure 9:
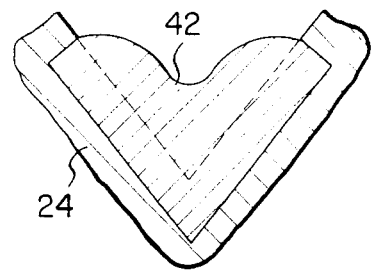

By heating this structure, an alloy type of Schottky junction is formed between the metal layer 40 and the second undoped n-type GaAs layer 24. In this case, the GaAs compound forming the V groove wall is converted into an alloy and the GaAs wall recedes. As a result, the V-shaped groove is deepened while its bottom end shape remained substantially unchanged. Conversion of the GaAs into an alloy by the heating operation is carried out as usual until, as shown in FIG. 7, the bottom end portion of the V-groove is introduced into the AlGaAs layer 22. An enlarged view of the V groove and the surrounding area involved in this heating process step is shown in FIGS. 8 and 9. As shown in FIG. 8, at a stage preceding the heating step, the metal 40 is deposited on the inner wall of the V groove formed in the GaAs layer 24. Upon heating the structure as shown in FIG. 9, conversion of the metal 40 and GaAs into the alloy proceeds, to form the desired alloy 42. At this time, since the GaAs compound constituting the V groove is changed into an alloy, the V groove wall recedes, with the result that this groove is deepened while its bottom end shape remains unchanged. What is indicated by the broken line in FIG. 9 is a groove which exists prior to the commencement of the heating step. The heating step is conducted at a temperature between the temperature enabling the alloy conversion and the temperature permitting the formation of ohmic electrodes. Where the metal employed is Pt and the compound semiconductor is GaAs, this temperature is approximately 400° C. The more advanced the alloy conversion is or, in other words, the longer the heating period is, the deeper the V groove becomes. The threshold voltage of the FET manufactured by the process of the invention is determined by the distance between the bottom end of the V groove and the channel layer 16. Accordingly, the FET threshold voltage can be controlled by adjusting the heating period. For this reason, if the heating step is carried out while measuring the threshold voltage, it is possible to obtain the desired level of threshold voltage with high precision. The heating step is usually carried out in a furnace. The heating procedure is performed by heating the structure in the furnace for an appropriate length of time and then withdrawing it to measure the threshold voltage. If the desired level of threshold voltage is not attained the structure may be returned to the furnace. By repeating this operation until the desired level of threshold voltage is obtained, it becomes possible to control the threshold voltage level with an extremely high degree of precision. It will be also possible to conduct the heating step while continuously monitoring the threshold voltage in the furnace. Other than heating period, deposition amount of metal 40 or heating temperature may also be control parameter. The alloy 42 becomes a gate electrode of the resultant FET.

When the heating operation is continued till the bottom end of the V groove enters the AlGaAs layer 22, a depletion region 44 (the region of FIG. 7 which is defined as that between the broken line and the V groove) produced at the bottom end of the V groove cuts off the channel layer 16, thereby completing an enhancement-type buried gate FET. Since the V groove has its bottom end pointed, it is possible to obtain an extremely short gate length. According to the method of the invention, it is possible to attain an effective gate length as small as approximately 0.1 μm. This makes it possible to cause an increase in the operational speed and frequency of the FET. Furthermore, an increase in the gate capacity of that portion of the gate electrode 42 forming the Schottky junction in cooperation with the GaAs layer 24 does not substantially occur, since the GaAs layer is undoped and the carrier density is correspondingly low. This factor also contributes to increasing the operational speed and frequency of the FET.

It is also possible to produce an FET with a buried type gate, without forming the above-mentioned V groove. That is, an FET may be produced by forming a groove with a flat bottom, instead the V-shaped groove, and by forming an alloy type of Schottky junction thereon. This method also permits control of the threshold voltage by adjustment of the heating period. Since, according to this method, the gate electrode is formed in the undoped layer, the gate capacity, which is produced at the side face portion of the gate electrode, is made extremely small. By this method, however, since the gate electrode is made flat, reduction of the gate length is not achieved. Thus, such a method is inferior to the process of the present invention, which is directed toward formation of a V groove.

EXAMPLE

A first undoped GaAs layer having a thickness of approximately 1 μm was formed on a semi-insulative substrate of GaAs by the widely known method of Molecular Beam Epitaxy (MBE Method). On this GaAs layer, an $Al_xGa_{1-x}As$ (x~0.3) layer of about 0.1 μm thickness was formed by MBE method, in which Si is doped as a donor impurity in a concentration of $6 \times 10^{17}$ cm$^{-3}$. Furthermore, on this layer, a second undoped GaAs layer was formed, which was approximately 0.7 μm in thickness. Upon this second undoped GaAs layer, a SiO$_2$ film having a thickness of approximately 0.1 μm was formed, by use of a known CVD method. Next, using a photoresist film, openings are formed in the CVD SiO$_2$ film at the prospective source and drain regions. A source and a drain region reaching the inside of the first undoped GaAs layer were formed by implanting S ions at the concentration of $4 \times 10^{13}$ ions/cm$^2$ and at an acceleration voltage of 600 KeV using the remaining CVD SiO$_2$ film and the photoresist film thereon as a mask. After the CVD SiO$_2$ film and the photoresist film were removed, an activation treatment of 850° C., 10 minutes was performed. Then, a CVD SiO$_2$ film of 0.1 μm thickness was again formed on the whole surface of the structure. Openings are formed in the CVD SiO$_2$ film at the source and drain regions. Au-Ge alloy was vapor-deposited on the whole surface of the structure followed by lift-off process. The structure was treated in the H$_2$ gas atmosphere under the temperature of 420° C. for 10 minutes to form source and drain electrodes.

Next, the entire surface of the structure was coated with a photoresist film photosensitive to the electron beams and, then, an opening portion with a width of 0.5 μm was formed by use of the direct electron beam method. The widthwise direction of this opening portion was made parallel to an intersecting line between the face (100) and face (110) of the single crystal of the second undoped GaAs layer. Next, by using this photoresist film as a mask, the CVD SiO$_2$ film was removed by an etching solution of ammonium fluoride, thereby forming a gate window. A portion of the second undoped n-type GaAs layer exposed from the gate window was also subjected to etching, along the face (110), by using a mixture of 50% aqueous solution of tartaric acid and 30% aqueous solution of hydrogen peroxide in a ratio of 5:1, thereby forming a V-shaped groove in the second undoped n-type GaAs layer. Next, Pt was vapor-deposited on the entire surface of the resultant structure. Thereafter, the photoresist film was dissolved by using J-100 (widely used product of Nagase Ind.) and was removed, along with the Pt deposited on the photoresist film. The resultant structure was heated in a furnace at a temperature of 400° C. The operation of drawing the resultant structure out of the furnace, for measuring the threshold voltage thereof, and putting the structure back into the furnace was repeated several times, to obtain the desired level of threshold voltage which was 0.1 V. The FET prepared in this Example had an effective gate length of approximately 0.1 μm.

What we claim is:

1. A process for manufacturing a buried gate field effect transistor, comprising, in the order mentioned, the steps of:

(a) providing a structure including a semi-insulative substrate, an undoped gallium arsenide layer formed on the semi-insulative layer, a GaAlAs layer formed on the undoped gallium arsenide layer, and an undoped semiconductor layer formed on the GaAlAs layer, a first impurity region acting as a source region being formed in the undoped gallium arsenide layer, a second impurity region acting as a drain region being formed in the undoped gallium arsenide layer, and a channel layer being provided between the first and second impurity regions;

(b) forming a V-shaped groove in a portion of the undoped semiconductor layer above the channel layer in the undoped gallium arsenide layer, by etching the undoped semiconductor layer with an etching solution which has a high selectivity toward the crystal face of the undoped semiconductor layer;

(c) vapor-depositing a metal likely to form an alloy type of Schottky junction with the undoped semiconductor layer, on the inner wall surfaces of the V-shaped groove; and (d) heating the resultant structure until the bottom end of the V-shaped groove enters the GaAlAs layer, and the channel layer attains a prescribed threshold voltage to form an alloy-type Schottky junction between the compound semiconductor and the metal.

2. The process of claim 1, wherein the undoped semiconductor layer is an undoped gallium arsenide layer.

3. The process of claim 1, wherein the metal is Pt or Rh.

4. The process of claim 1, wherein the heating step (d) is carried out while measuring the threshold voltage of the channel layer.

5. The process of claim 1, wherein the heating step is carried out in at least one step, the measurement of the threshold voltage of the channel layer being made after the performance of each step.

* * * * *